(12) United States Patent
Sakurai

(10) Patent No.: US 7,876,043 B2
(45) Date of Patent: Jan. 25, 2011

(54) LIGHT-EMITTING DEVICE

(75) Inventor: Kazunori Sakurai, Chino (JP)

(73) Assignee: Seiko Epson Corporation, Tokyo (JP)

( * ) Notice: Subject to any disclaimer, the term of this patent is extended or adjusted under 35 U.S.C. 154(b) by 274 days.

(21) Appl. No.: 12/190,391

(22) Filed: Aug. 12, 2008

(65) Prior Publication Data

US 2009/0066243 A1    Mar. 12, 2009

(30) Foreign Application Priority Data

Sep. 11, 2007    (JP) .............................. 2007-235049

(51) Int. Cl.
*H01J 1/62* (2006.01)
(52) U.S. Cl. ...................... 313/512; 313/506
(58) Field of Classification Search .......... 313/498–512
See application file for complete search history.

(56) References Cited

U.S. PATENT DOCUMENTS

2006/0220549 A1* 10/2006 Kim et al. ................... 313/512

2007/0132376 A1* 6/2007 Heo ............................ 313/505
2007/0171350 A1* 7/2007 Andoh ....................... 349/153

FOREIGN PATENT DOCUMENTS

JP    A-2002-280168    9/2002

* cited by examiner

*Primary Examiner*—Bumsuk Won
(74) *Attorney, Agent, or Firm*—Oliff & Berridge, PLC

(57) ABSTRACT

A light-emitting device includes a substrate on which a laminate is disposed, a sealing substrate bonded to the substrate with a plurality of seals therebetween, a plurality of mounting sites in regions surrounded by the seals on the sealing substrate, and a plurality of adsorbers disposed in the mounting sites to adsorb water and oxygen. The laminate includes a first electrode, a second electrode, and an electrooptical material therebetween. The electrooptical material at least includes a light-emitting layer. The seals have the shape of a double or multiple frame surrounding the periphery of the laminate on the substrate.

7 Claims, 14 Drawing Sheets

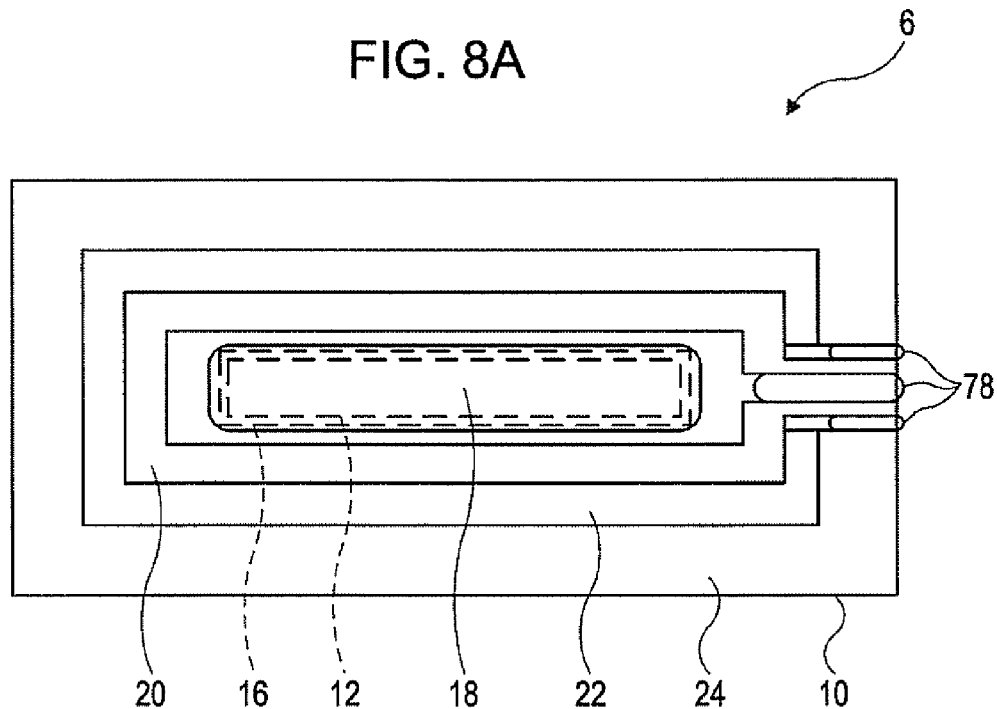
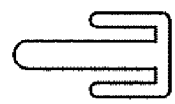

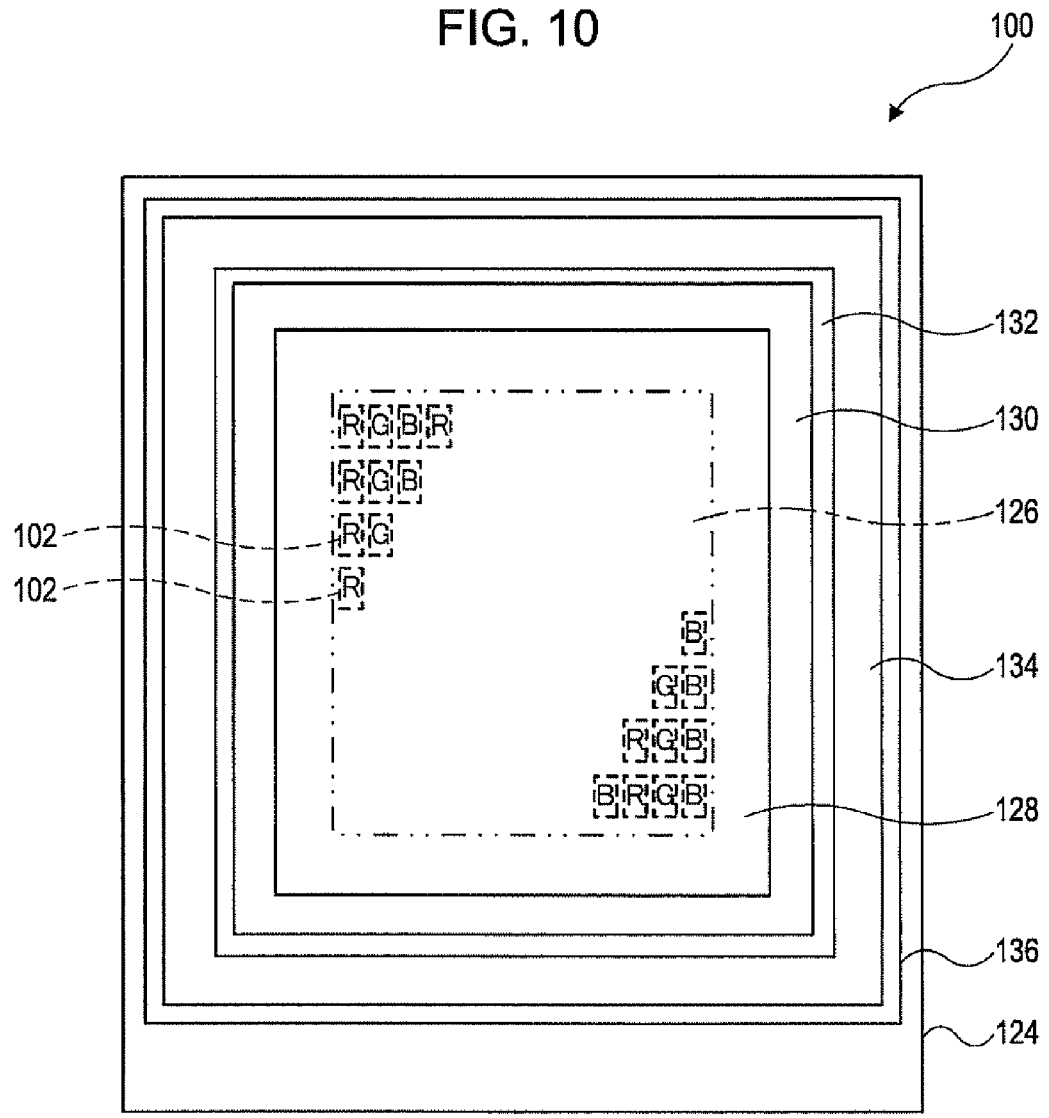

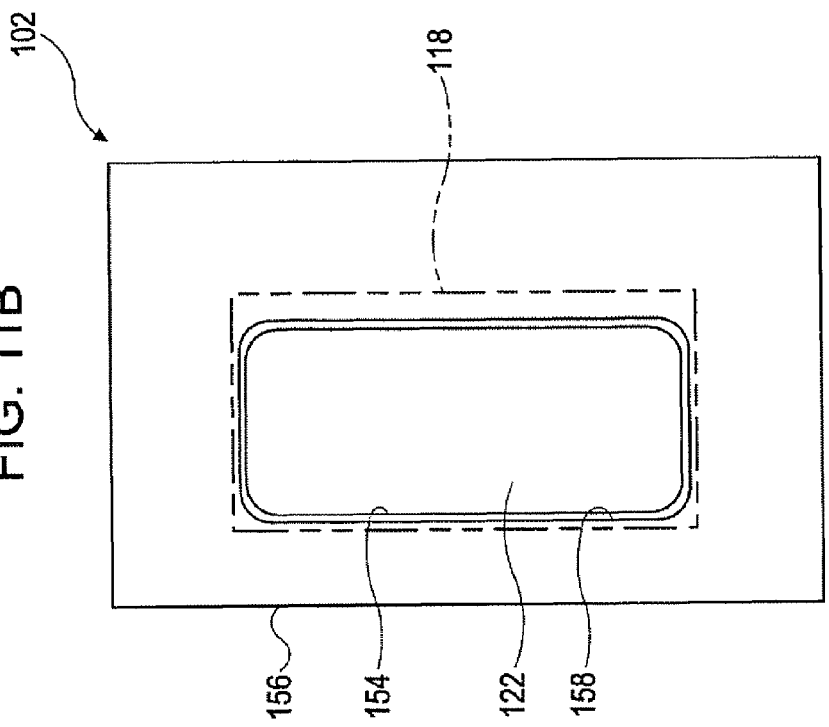
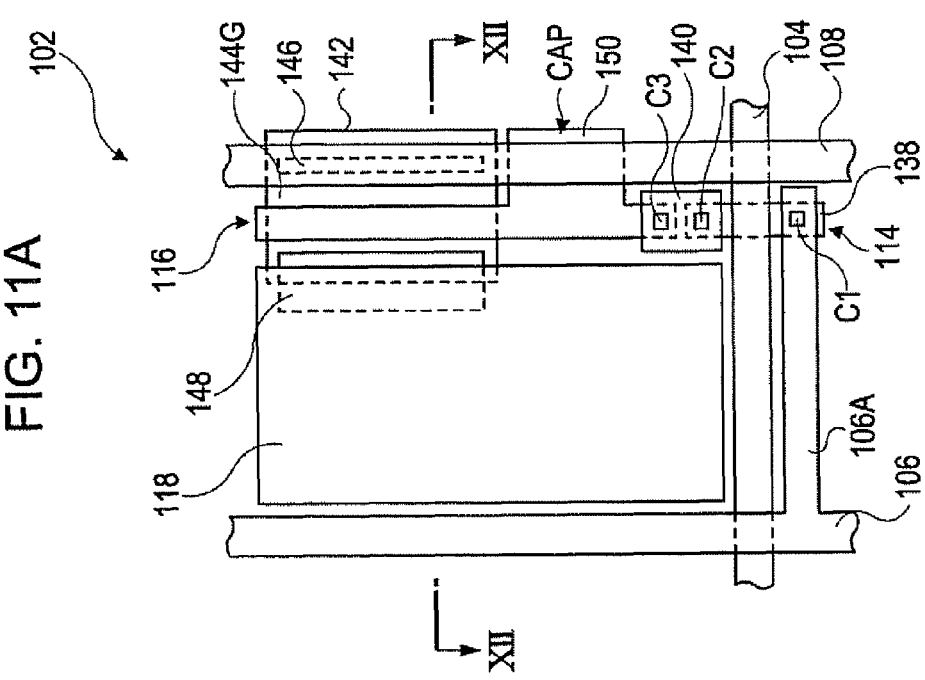

LIGHT-EMITTING DEVICE

BACKGROUND

1. Technical Field

The present invention relates to light-emitting devices.

2. Related Art

Light-emitting devices that include light-emitting elements, such as organic electroluminescent (EL) elements, on substrates are now widely used as, for example, displays and exposure units of electrophotographic image-forming apparatuses.

Such light-emitting devices require enough durability to withstand an extended period of light emission. One factor that degrades the light-emission characteristics of organic EL elements is dark spots. A dark spot occurs in a laminate of a transparent electrode, a light-emitting layer (organic layer), and a back electrode if the organic layer is delaminated from the back electrode by the intrusion of water deposited on components of the organic EL elements or water (moisture) or atmospheric gas, including oxygen, entering the organic EL elements into the laminate through, for example, defects in the surface of the back electrode.

To increase the reliability and life of the organic EL elements in the light-emitting devices, it is important to make sure that the light-emitting layer and the electrodes of the organic EL elements are insulated from the atmospheric gas. To that end, there are some known techniques for bonding a sealing member with an adhesive to a substrate (transparent substrate) on which organic EL elements are formed to seal the organic EL elements therebetween, thereby protecting the organic EL elements from, for example, atmospheric gas.

JP-A-2002-280168, for example, discloses a light-emitting device including a transparent glass substrate, a laminate on the substrate, a glass sealing member having a recess and hermetically bonded to the substrate with an adhesive so as to cover the laminate, and a moisture adsorber on the surface of the sealing member opposite the laminate. The laminate includes a transparent electrode (anode) formed of, for example, indium tin oxide (ITO), an organic layer at least including a light-emitting layer, and a nontransparent back electrode (cathode) formed of, for example, aluminum (Al). The moisture adsorber is formed of a compound that chemically adsorbs water and that remains solid after adsorbing water.

For such hollow sealing with an adhesive and a glass lid, however, the atmospheric gas may intrude into the internal space through the interface between the sealing member and the substrate because of insufficient adhesion, depending on the thickness and width, for example, of the adhesive applied.

SUMMARY

A light-emitting device according to an aspect of the invention includes a substrate on which a laminate is disposed, a sealing substrate bonded to the substrate with a plurality of seals therebetween, a plurality of mounting sites in regions surrounded by the seals on the sealing substrate, and a plurality of adsorbers disposed in the mounting sites to adsorb water and oxygen. The laminate includes a first electrode, a second electrode, and an electrooptical material therebetween. The electrooptical material at least includes a light-emitting layer. The seals have the shape of a double or multiple frame surrounding the periphery of the laminate on the substrate.

Because the plurality of adsorbers and the plurality of seals are provided, external water (moisture), oxygen, and the like intruding into the light-emitting device have to sequentially pass through the plurality of adsorbers and the plurality of seals before reaching a light-emitting element, which is susceptible to water (moisture), oxygen, and the like. This extends the time until the light-emitting element is degraded.

In the above light-emitting device, it is preferable that the plurality of seals have a rectangular shape in plan view.

In this case, the seals can easily be formed.

In the above light-emitting device, it is preferable that the plurality of seals include a first seal surrounding the periphery of the laminate on the substrate and a second seal surrounding the periphery of the first seal, that the plurality of mounting sites include a first mounting site in a region surrounded by the first seal on the sealing substrate and a second mounting site in a region surrounded by the first seal and the second seal on the sealing substrate, and that the plurality of adsorbers include a first adsorber in the first mounting site and a second adsorber in the second mounting site.

In this case, because the first and second adsorbers and the first and second seals are provided, the second adsorber adsorbs external water (moisture), oxygen, and the like intruding into the light-emitting device, thus preventing them from intruding into the first mounting site before the amount of adsorption exceeds the capacity of the second adsorber. This extends the time until the light-emitting element, which is susceptible to water (moisture), oxygen, and the like, is degraded.

In the above light-emitting device, it is preferable that the first and second mounting sites each have a recess, that the first seal be disposed on a first support formed of a protrusion around the recess in the first mounting site, and that the second seal be disposed on a second support formed of a protrusion around the recess in the second mounting site.

In this case, the regions where the seals and the adsorbers are disposed are clearly defined. In addition, because the first and second adsorbers and the first and second seals are provided, the second adsorber in the recess in the second mounting site adsorbs external water (moisture), oxygen, and the like intruding into the light-emitting device, thus preventing them from intruding into the recess in the first mounting site before the amount of adsorption exceeds the capacity of the second adsorber. This extends the time until the light-emitting element, which is susceptible to water (moisture), oxygen, and the like, is degraded.

In the above light-emitting device, it is preferable that the first and second adsorbers have different adsorption capabilities.

In this case, the balance between adsorption capability and cost can readily be taken into consideration.

In the above light-emitting device, it is preferable that the first adsorber adsorb a larger amount of water and oxygen than the second adsorber.

In this case, the adsorbers can inhibit degradation of the light-emitting element due to water and the like for an extended period of time.

In the above light-emitting device, it is preferable that the second adsorber adsorb water and oxygen at a higher rate than the first adsorber.

In this case, the second adsorber can prevent a deterioration in the adsorption capability of the first adsorber, which is closer to the light-emitting element, thus inhibiting degradation of the light-emitting element due to water and the like for an extended period of time.

In the above light-emitting device, it is preferable that the light-emitting device further include a seal opening formed by partially joining the first and second supports together, a first discontinuous portion where the frame shape of the first seal on the first support is interrupted at the seal opening, and a second discontinuous portion where the frame shape of the second seal on the second support is interrupted at the seal opening, that the first discontinuous portion extends outward to the second discontinuous portion, and that the seal opening is sealed by a plurality of opening-sealing members.

In this case, the light-emitting element can effectively be prevented from being damaged.

In the above light-emitting device, it is preferable that the plurality of opening-sealing members be integrated.

In this case, variations between the opening-sealing members can be reduced.

In the above light-emitting device, it is preferable that no adsorber be disposed at a position on the sealing substrate opposite the laminate on the substrate.

In this case, a compact device with desired performance can readily be provided.

BRIEF DESCRIPTION OF THE DRAWINGS

The invention will be described with reference to the accompanying drawings, wherein like numbers reference like elements.

FIG. 8A is a plan view of the organic EL device according to the other embodiment.

FIG. 8B is a diagram showing integrated opening-sealing members.

FIG. 10 is a plan view of the organic EL display of this example.

FIG. 11A is a plan view showing a one-pixel region on the organic EL display of this example.

FIG. 11B is a diagram showing a bank in the organic EL display of this example.

DESCRIPTION OF EXEMPLARY EMBODIMENTS

Organic EL Device

Figure 1A:
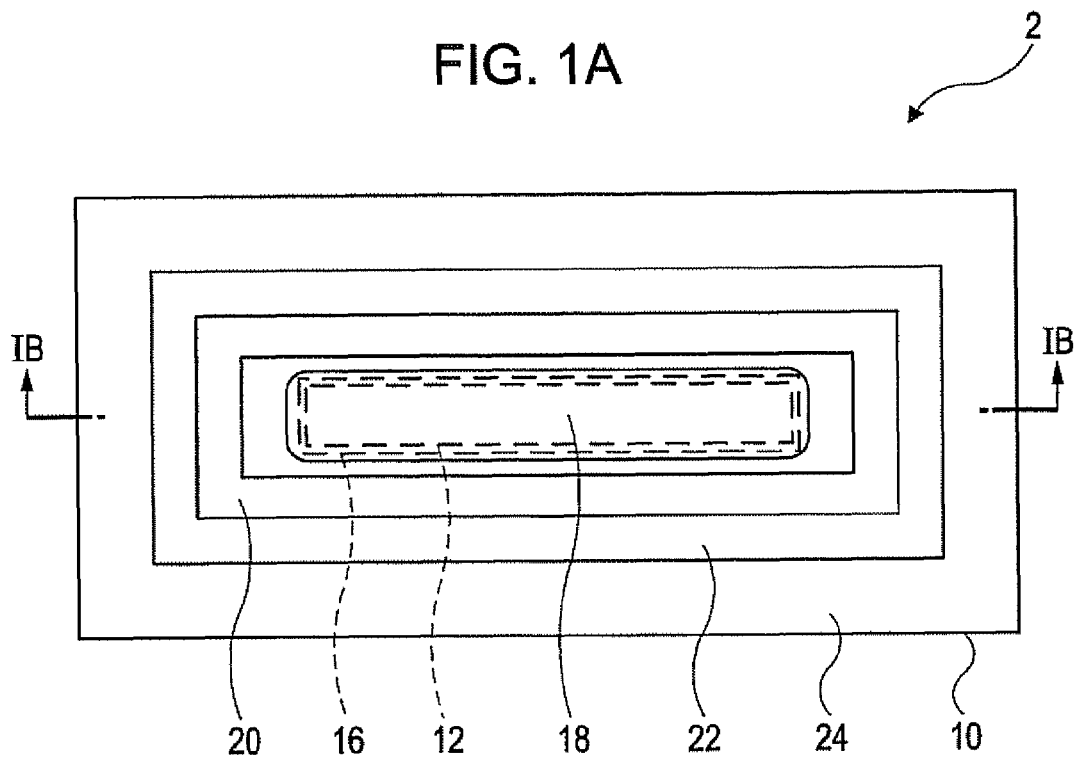
FIG. 1A is a plan view of an organic EL device according to an embodiment of the invention.
Figure 1B:
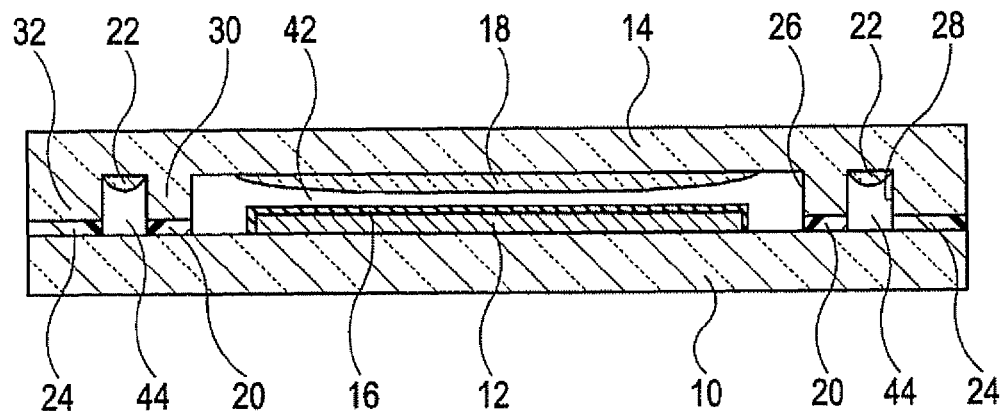
FIG. 1B is a sectional view taken along line IB-IB of FIG. 1A.

FIG. 1A is a plan view of an organic EL device 2 as an example of a light-emitting device according to an embodiment of the invention. FIG. 1B is a sectional view taken along line IB-IB of FIG. 1A.

Referring to FIGS. 1A and 1B, the organic EL device 2 according to this embodiment mainly includes a substrate 10, a light-emitting element 12 formed of a laminate on the substrate 10, and a sealing substrate 14 disposed opposite the substrate 10 with the light-emitting element 12 therebetween. Between the substrate 10 and the sealing substrate 14 are a protective layer 16 covering the light-emitting element 12, a first adsorber 18 disposed opposite the protective layer 16, a first seal 20 disposed around the protective layer 16, a second adsorber 22 disposed around the first seal 20, and a second seal 24 disposed around the second adsorber 22. For illustration purposes, the sealing substrate 14 is not shown in FIG. 1A.

The organic EL device 2 according to this embodiment may have either a structure (bottom-emission structure) in which light emitted from the light-emitting element 12 exits the device 2 through the substrate 10 or a structure (top-emission structure) in which the light emitted from the light-emitting element 12 exits the device 2 through the sealing substrate 14. For the bottom-emission structure, the substrate 10 is formed of a transparent or translucent material, for example, glass, quartz, or sapphire or a transparent synthetic resin such as polyester, polyacrylate, polycarbonate, or polyetherketone. For the top-emission structure, the protective layer 16, the first adsorber 18, and the sealing substrate 14 are formed of transparent or translucent materials.

The sealing substrate 14 has a first recess 26, corresponding to a first mounting site, that faces the light-emitting element 12 and a second recess 28, corresponding to a second mounting site, that has a rectangular frame shape surrounding the periphery of the first recess 26 in plan view. The first recess 26 and the second recess 28 are disposed in the surface of the sealing substrate 14 opposite the substrate 10. The sealing substrate 14 covers the light-emitting element 12, the protective layer 16, the first adsorber 18, and the second adsorber 22. The sealing substrate 14 is bonded to the substrate 10 with the first seal 20 and the second seal 24 therebetween so that the light-emitting element 12 is sealed therebetween. The first seal 20 is disposed on a first protrusion 30, corresponding to a first support, around the first recess 26. The second seal 24 is disposed on a second protrusion 32, corresponding to a second support, around the second recess 28.

The sealing substrate 14 may be formed of any material that can sufficiently protect the light-emitting element 12, the protective layer 16, the first adsorber 18, and the second adsorber 22, for example, a material with low water permeability, such as glass, quartz, a synthetic resin, or a metal. Examples of glass include soda-lime glass, lead-alkali glass, borosilicate glass, aluminosilicate glass, and silica glass. Examples of synthetic resins include transparent synthetic resins such as polyolefin, polyester, polyacrylate, polycarbonate, and polyetherketone. Examples of metals include aluminum and stainless steel.

If a glass substrate is used as the sealing substrate 14 to cover the entire surface of the protective layer 16, it can sufficiently prevent intrusion of water (moisture), oxygen, and the like into the light-emitting element 12. If a sufficient space is ensured for the light-emitting element 12 and the protective layer 16 by adjusting the thickness of the first seal 20 and the second seal 24, the recesses 26 and 28 and the protrusions 30 and 32 do not have to be formed on the sealing substrate 14; it may be bonded to the substrate 10 with the first seal 20, the first adsorber 18, the second seal 24, and the second adsorber 22 disposed in their corresponding regions on the sealing substrate 14.

The light-emitting element 12, disposed on the substrate 10, is an organic EL element that includes two electrode films, corresponding to first and second electrodes, and an organic functional layer held therebetween. The organic functional layer, corresponding to an electrooptical material, includes an organic light-emitting layer. Referring to FIG. 2B, the light-emitting element 12 has a multilayer structure including, for example, an anode 34, a hole-injecting layer 36, a light-emitting layer 38, and a cathode 40. The light-emitting element 12 may be formed in various patterns, depending on the application of the organic EL device 2. For illumination applications, for example, the light-emitting element 12 may be formed in a solid planar pattern. For display units of electronic apparatuses, a plurality of light-emitting elements 12 may be arranged substantially in a matrix pattern in plan view. For exposure units of printers, a plurality of light-emitting elements 12 may be arranged in a single line or a plurality of lines.

Referring back to FIGS. 1A and 1B, the protective layer 16 is a thin film formed of an inorganic insulating material and functions to inhibit intrusion of water and the like into the light-emitting element 12. The protective layer 16 may be formed of, for example, silicon oxynitride (SiON), silicon dioxide ($SiO_2$), or silicon nitride (SiN).

In this embodiment, the single protective layer 16 is provided between the light-emitting element 12 and the sealing substrate 14, although it does not have to be provided. Alternatively, a plurality of protective layers 16 may be provided between the light-emitting element 12 and the sealing substrate 14. If the plurality of protective layers 16 are provided, cracking can be prevented. In addition, the multilayer structure of the protective layers 16 enhances sealing performance for the light-emitting element 12.

The first adsorber 18 is provided in the first recess 26 of the sealing substrate 14. The first adsorber 18 is disposed opposite the protective layer 16, which is substantially rectangular in plan view, and the first adsorber 18 is substantially rectangular in plan view. Although in this embodiment the first adsorber 18 is formed in a substantially rectangular shape in plan view, it may instead be formed, for example, in a frame shape corresponding to the shape of the light-emitting element 12 or the protective layer 16, or in any frame shape surrounding the light-emitting element 12. In this embodiment, as shown in FIG. 1B, a gap 42 is formed between the first adsorber 18 and the protective layer 16. Of the two substrates 10 and 14, the first adsorber 18 is in contact with the sealing substrate 14. The first adsorber 18 is preferably formed of a material that can maintain a predetermined planar shape and cross-sectional shape. The first adsorber 18 can have superior formability if the material used is, for example, one prepared by dispersing an adsorbent (such as a desiccant or an oxygen scavenger) that adsorbs water (moisture), oxygen, and the like in a binder such as resin, wax, or oil.

The adsorbent used is one that has low reactivity with the organic compound used as the binder. Examples of the adsorbent include calcium hydride, strontium hydride, barium hydride, aluminum hydride, sodium oxide, potassium oxide, calcium oxide, barium oxide, and magnesium oxide.

The binder used may be, for example, resin, wax, or oil. Examples of the binder include resins such as polyethylene and polypropylene, petroleum waxes such as paraffin wax and microcrystalline wax, vegetable waxes, animal waxes, mineral waxes, fatty acids, fatty acid esters, fatty acid amides, and fatty amines.

If a mixture of a binder and an adsorbent is not used for the first adsorber 18, various other adsorbents that have a desired adsorption function in the sealed space, including the gap 42, between the substrate 10 and the sealing substrate 14 can be used without considering the above limitation on the adsorbent. For example, silica gel, zeolite, activated carbon, calcium oxide, germanium oxide, phosphorus pentoxide, or calcium chloride may be used alone or in combination. If the gap 42 is formed, water (moisture), oxygen, and the like intruding into the gap 42 through the first seal 20 diffuse across the gap 42, so that the load on the first adsorber 18 can be uniformly distributed over its surface. The above structure can therefore maintain a superior adsorption effect over an extended period of time, thus increasing the reliability and durability of the organic EL device 2.

The first seal 20 is disposed on the first protrusion 30 of the sealing substrate 14. The first seal 20 has a rectangular frame shape surrounding the periphery of the protective layer 16 in plan view and is held between the substrate 10 and the sealing substrate 14. In this embodiment, the first seal 20 also functions as an adhesive to bond the substrate 10 and the sealing substrate 14 together. The first seal 20 may be formed of any material that can maintain stable adhesion strength and good hermeticity; an example is a thermosetting resin. Another example of the material of the first seal 20 is a photocurable epoxy resin, which cures under ultraviolet (UV) irradiation.

The first seal 20 is preferably formed of a material with a low elastic modulus, particularly, a material with a lower elastic modulus than the second seal 24, as described below. If the first seal 20 has a lower elastic modulus than the second seal 24, the sealing substrate 14 is supported by the second seal 24, so that the device 2 can readily be formed.

The first seal 20 may contain grains (spacers) that separate the sealing substrate 14 from the substrate 10 at a predetermined distance. These grains can prevent the light-emitting element 12 from being damaged by pressing when the sealing substrate 14 is bonded. The grains also function to maintain the gap 42 between the first adsorber 18 and the protective layer 16 over the light-emitting element 12 at a predetermined distance.

The second adsorber 22 is provided in the second recess 28 of the sealing substrate 14. The second adsorber 22 has a rectangular frame shape surrounding the periphery of the first seal 20 in plan view and is disposed between the substrate 10 and the sealing substrate 14. In this embodiment, as shown in FIG. 1B, of the two substrates 10 and 14, the second adsorber 22 is in contact with the sealing substrate 14, and a gap 44 is formed between the second adsorber 22 and the substrate 10. Like the first adsorber 18, the second adsorber 22 is preferably formed of a material that can maintain a predetermined planar shape and cross-sectional shape. The second adsorber 22 can have superior formability if the material used is, for example, one prepared by dispersing an adsorbent that adsorbs water (moisture), oxygen, and the like in a binder such as resin, wax, or oil.

If the gap 44 is formed, water (moisture), oxygen, and the like intruding into the gap 44 through the second seal 24 diffuse across the gap 44, so that the load on the second adsorber 22 can be uniformly distributed over its surface. The above structure can therefore maintain a superior adsorption effect over an extended period of time, thus increasing the reliability and durability of the organic EL device 2.

The second adsorber 22 may be disposed in contact with both the substrate 10 and the sealing substrate 14. In this case, even if water (moisture), oxygen, and the like intrude into the device 2 through the outermost seal, namely, the second seal 24, they contact the second adsorber 22 and are adsorbed thereby with certainty. This effectively prevents water (moisture), oxygen, and the like from intruding into the inner region through the second adsorber 22. The two adsorbers 18 and 22 used may be of the same type or have different adsorption capabilities. For example, the second adsorber 22 used may be one that adsorbs water (moisture), oxygen, and the like at a higher rate than the first adsorber 18. If the second adsorber 22 adsorbs most of water and the like present immediately after the formation of the device 2, it can prevent a deterioration in the adsorption capability of the first adsorber 18, which is closer to the light-emitting element 12, thus inhibiting degradation of the light-emitting element 12 due to water and the like for an extended period of time. In addition, the first adsorber 18 used may be one that adsorbs a larger amount of water and the like than the second adsorber 22. This inhibits degradation of the light-emitting element 12 due to water and the like for an extended period of time. It is also possible that the first adsorber 18 used be one that adsorbs water and the like at a higher rate than the second adsorber 22 and that the second adsorber 22 used be one that adsorbs a larger amount of water and the like than the first adsorber 18.

The second seal 24 is disposed on the second protrusion 32 of the sealing substrate 14. The second seal 24 has a rectangular frame shape surrounding the periphery of the second adsorber 22 in plan view and is held between the substrate 10 and the sealing substrate 14. In this embodiment, the second seal 24 also functions as an adhesive to bond the substrate 10 and the sealing substrate 14 together. The second seal 24 may be formed of any material that can maintain stable adhesion strength and good hermeticity. An example is a photocurable epoxy resin, which cures under UV irradiation. In addition to cationically curable materials such as epoxides and vinyl ethers, radical-curable materials such as acrylates (e.g., ester acrylates and urethane acrylates) and urethane polyester can also be used.

The second seal 24 is preferably formed of a material with a lower permeability for water (moisture), oxygen, and the like than the first seal 20. If such a material is provided in the outermost region of the device 2 to block water (moisture), oxygen, and the like, it can reduce the amount of water (moisture), oxygen, and the like reaching the second adsorber 22 inside. This reduces the amount of water (moisture), oxygen, and the like reaching the light-emitting element 12 and extends the time until water (moisture), oxygen, and the like reach the light-emitting element 12, thus increasing the life of the light-emitting element 12.

Like the first seal 20, the second seal 24 may contain grains (spacers) that separate the sealing substrate 14 from the substrate 10 at a predetermined distance. These grains can prevent the light-emitting element 12 from being damaged by pressing when the sealing substrate 14 is bonded. The grains also function to maintain the first adsorber 18 over the light-emitting element 12 at a predetermined thickness.

As described above, because the first adsorber 18, the second adsorber 22, the first seal 20, and the second seal 24 are provided, the second adsorber 22 in the second recess 28 adsorbs external water (moisture), oxygen, and the like intruding into the device 2, thus preventing them from intruding into the first recess 26 before the amount of adsorption exceeds the capacity of the second adsorber 22. This extends the time until the light-emitting element 12, which is susceptible to water (moisture), oxygen, and the like, is degraded. Thus, the organic EL device 2 according to this embodiment has excellent sealing performance for the light-emitting element 12 because of the double sealing structure of the first adsorber 18, the second adsorber 22, the first seal 20, and the second seal 24.

Method for Producing Organic EL Device

Next, a method for producing the organic EL device 2 having the above structure will be described with reference to FIGS. 2A and 2B to 5A and 5B. FIGS. 2A, 3A, 4A, and 5A are plan views illustrating the steps of the method. FIGS. 2B, 3B, 4B, and 5B are sectional views taken along lines IIB-IIB, IIIB-IIIB, IVB-IVB, and VB-VB of FIGS. 2A, 3A, 4A, and 5A, respectively. For illustration purposes, the sealing substrate 14 is not shown in FIG. 5A.

Figure 2A:
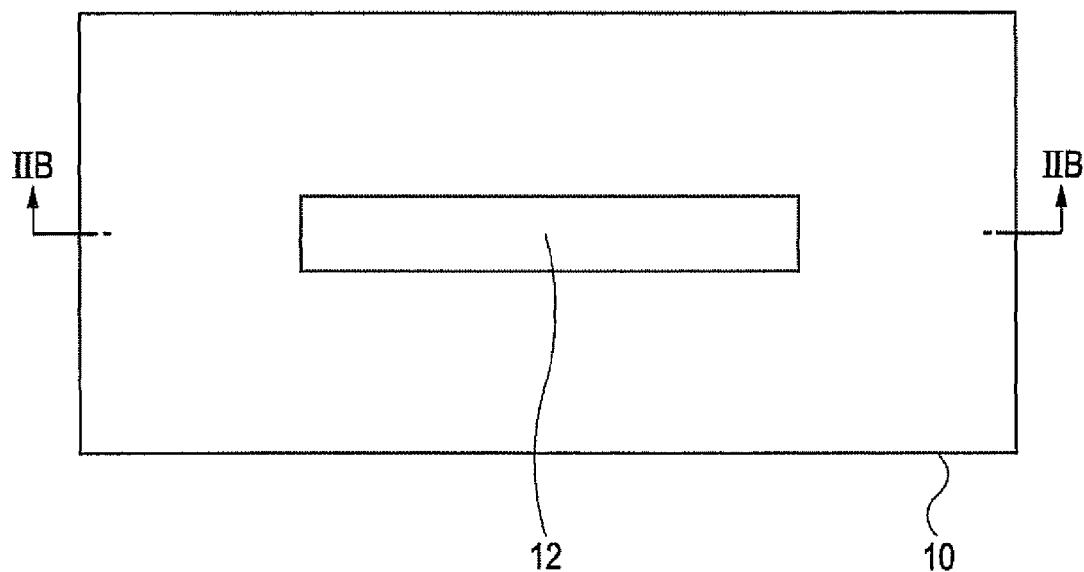
FIG. 2A is a plan view illustrating a process of producing the organic EL device according to the embodiment.
Figure 2B:
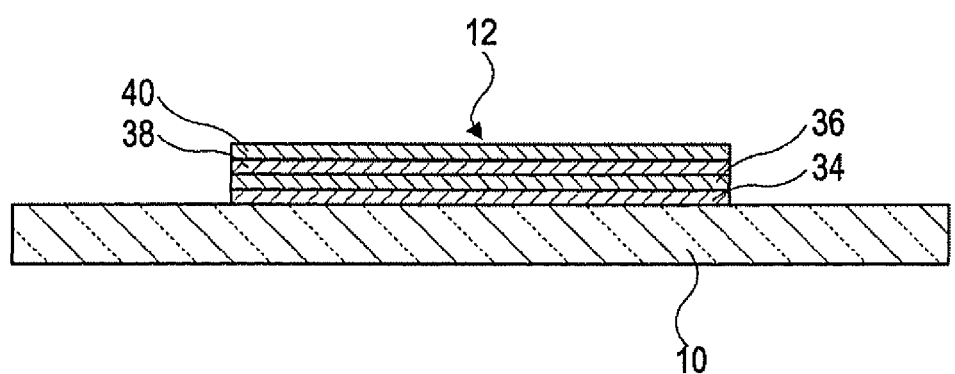
FIG. 2B is a sectional view taken along line IIB-IIB of FIG. 2A.

Referring to FIGS. 2A and 2B, first, the light-emitting element 12 is formed on the substrate 10. Although not shown in FIGS. 2A and 23, a drive circuit for driving the light-emitting element 12, for example, has been formed on the substrate 10 on which the light-emitting element 12 is formed.

The light-emitting element 12 can be formed by sequentially stacking the anode 34, the hole-transporting layer 36, the light-emitting layer 38, and the cathode 40 in a predetermined region on the substrate 10. In the light-emitting element 12, having the above multilayer structure, a drive signal supplied from the drive circuit causes a current to flow between the anode 34 and the cathode 40, so that the light-emitting layer 38 emits light. For the bottom-emission structure, the light exits through the substrate 10, which is transparent in this case.

In the multilayer structure shown in FIG. 2B, the anode 34 is connected to the drive circuit (not shown) to inject holes into the hole-transporting layer 36 when supplied with a voltage from the drive circuit. The anode 34 may be formed of, for example, a transparent conductive material, such as ITO, or a metal, such as aluminum or silver.

The hole-transporting layer 36 functions to transport and inject holes from the anode 34 to the light-emitting layer 38. The hole-transporting layer 36 may be formed of a known material such as polythiophene, polyaniline, or polypyrrole. One specific example is 3,4-polyethylenedioxythiophene/polystyrenesulfonic acid (PEDOT/PSS).

The light-emitting layer 38 emits light by recombining holes injected from the hole-injecting layer 36 with electrons injected from the cathode 40. The light-emitting layer 38 may be formed of a known light-emitting material that can emit fluorescence or phosphorescence. Examples of the material used include polyfluorene (PF) derivatives, poly(p-phenylene vinylene) (PPV) derivatives, polyphenylene (PP) derivatives, poly(p-phenylene) (PPP) derivatives, polyvinylcarbazole (PVK), polythiophene derivatives, and polysilanes (e.g., polymethylphenylsilane (PMPS)).

An electron-transporting layer may also be formed between the light-emitting layer 38 and the cathode 40. The electron-transporting layer can improve the efficiency of electron injection from the cathode 40 to the light-emitting layer 38. Examples of the material of the electron-transporting layer include oxadiazole derivatives, anthraquinodimethane and its derivatives, benzoquinone and its derivatives, naphthoquinone and its derivatives, anthraquinone and its derivatives, tetracyanoanthraquinodimethane and its derivatives, fluorenone derivatives, diphenyldicyanoethylene and its derivatives, diphenoquinone derivatives, and metal complexes of 8-hydroxyquinoline and its derivatives.

The cathode 40 is formed of a metal with a low enough work function to efficiently inject electrons into the light-emitting layer 38, for example, aluminum (Al), magnesium (Mg), gold (Au), silver (Ag), or calcium (Ca). A transparent conductive film, such as an ITO film, may be stacked on the metal film.

The individual layers constituting the light-emitting element 12 may be formed by a known patterning process such as photolithography or droplet ejection. The multilayer structure of the light-emitting element 12 can thus be formed in a predetermined region on the substrate 10.

Sputtering or vacuum deposition and photolithography are suitable for the formation of the anode 34 and the cathode 40 using metals or transparent conductive materials, whereas droplet ejection is suitable for the formation of the hole-transporting layer 36 and the light-emitting layer 38 using polymers.

Droplet ejection is a method of applying the material of a functional layer in a target region by ejecting the material in liquid form in predetermined amounts using a droplet-ejecting apparatus such as a dispenser or an ink-jet apparatus. Specifically, this is a technique of forming a desired film pattern on the substrate 10 with a liquid by ejecting droplets of the liquid in a controlled amount per droplet from a nozzle mounted on a droplet-ejecting head (ink-jet head) so as to face the substrate 10 while moving the nozzle relative to the substrate 10.

Forming the hole-transporting layer 36 and the light-emitting layer 38 by droplet ejection reduces production costs. That is, droplet ejection is a simpler film-formation process and also wastes less material than photolithography, for example, because a material can be applied locally to a target region on the substrate 10.

Figure 3A:
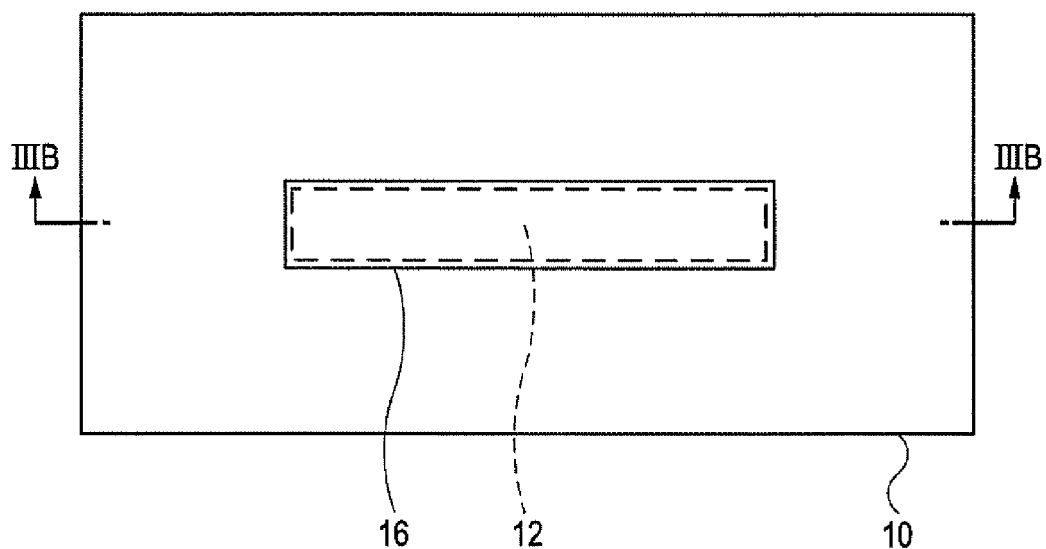
FIG. 3A is a plan view illustrating the process of producing the organic EL device according to the embodiment.
Figure 3B:
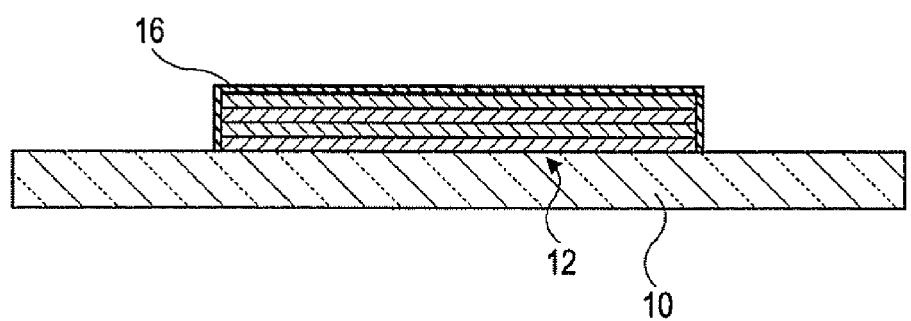
FIG. 3B is a sectional view taken along line IIIB-IIIB of FIG. 3A.

Referring to FIGS. 3A and 3B, after the light-emitting element 12 is formed on the substrate 10, the protective layer 16 is formed over the light-emitting element 12 by an appropriate process. In this embodiment, the protective layer 16 is formed over the surface of the light-emitting element 12 by a film-formation process such as ion plating or sputtering. Thus, the protective layer 16 is formed so as to cover the surface of the light-emitting element 12. Forming the protective layer 16 at a predetermined thickness over the surface of the light-emitting element 12 prevents the light-emitting element 12 from coming into contact with water and the like during the production process of the organic EL device 2. Thus, the protective layer 16 can sufficiently seal the light-emitting element 12.

Figure 4A:
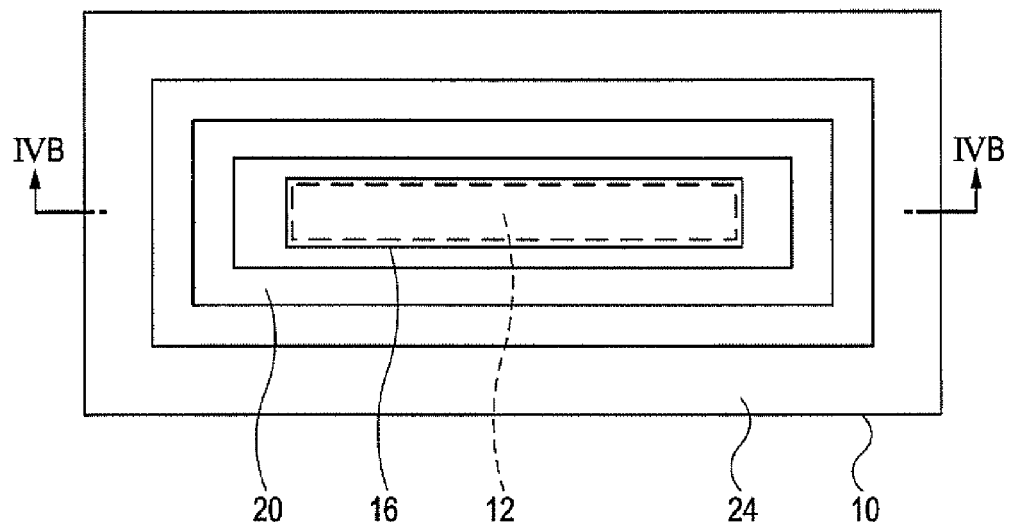
FIG. 4A is a plan view illustrating the process of producing the organic EL device according to the embodiment.
Figure 4B:
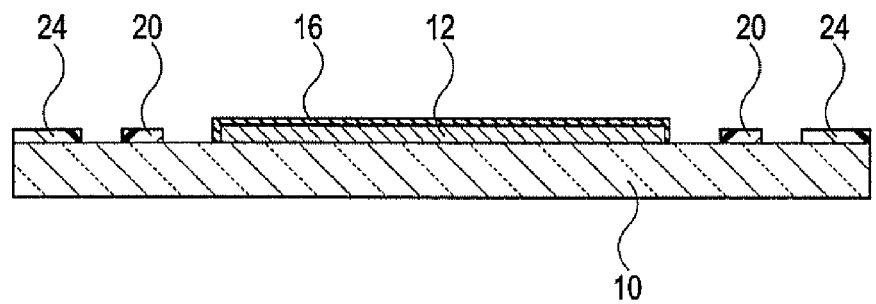
FIG. 4B is a sectional view taken along line IVB-IVB of FIG. 4A.

Referring to FIGS. 4A and 4B, the first seal 20 and the second seal 24 are formed in a rectangular frame shape in plan view along the periphery of the surface of the substrate 10 on which the light-emitting element 12 is formed. For example, a resin material, such as epoxy resin, is applied in the planar pattern shown in FIG. 4A using a dispenser or an ink-jet apparatus. The resin material used may be one containing spacers for adjusting the distance between the substrate 10 and the sealing substrate 14. The spacers used may be, for example, glass beads or resin beads. The individual production steps are preferably carried out in an inert gas atmosphere such as nitrogen gas or argon gas to prevent degradation of the light-emitting element 12.

The resin material applied to the substrate 10 is preferably one capable of sealing the device 2 by adhering to the sealing substrate 14 when the sealing substrate 14 is stacked on the substrate 10 later. In the subsequent steps, the resin material is maintained in such a state that it can adhere to the sealing substrate 14 later. After the resin material is applied to the substrate 10, it may be cured to such an extent as not to lose its adhesiveness (preliminary curing). The preliminary curing increases the viscosity of the resin material of the first seal 20 and the second seal 24, thus allowing their shapes to be maintained on the substrate 10. This prevents a decrease in yield due to defects in the shapes of the first seal 20 and the second seal 24 and also improves the ease of handling of the substrate 10 in the subsequent steps.

Figure 5A:
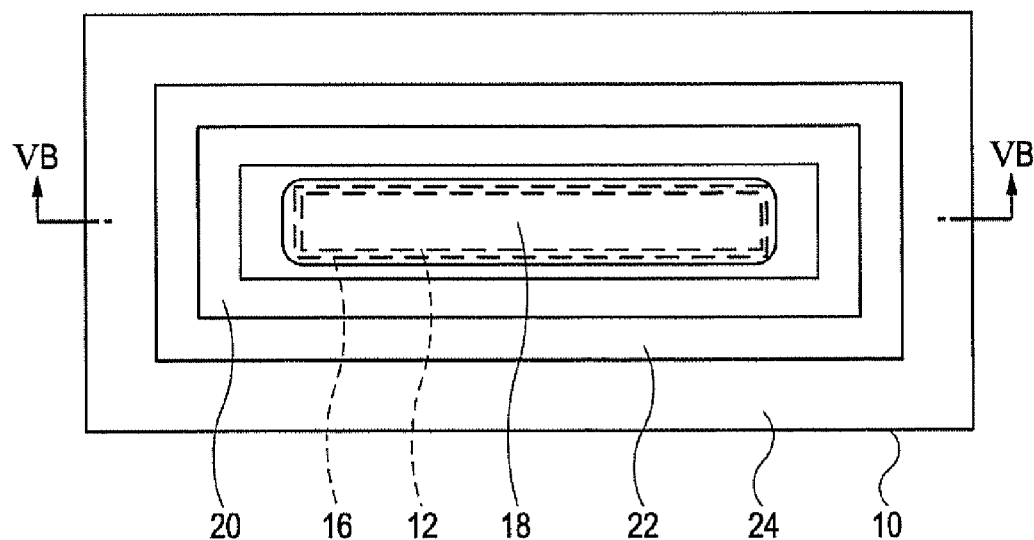
FIG. 5A is a plan view illustrating the process of producing the organic EL device according to the embodiment.
Figure 5B:
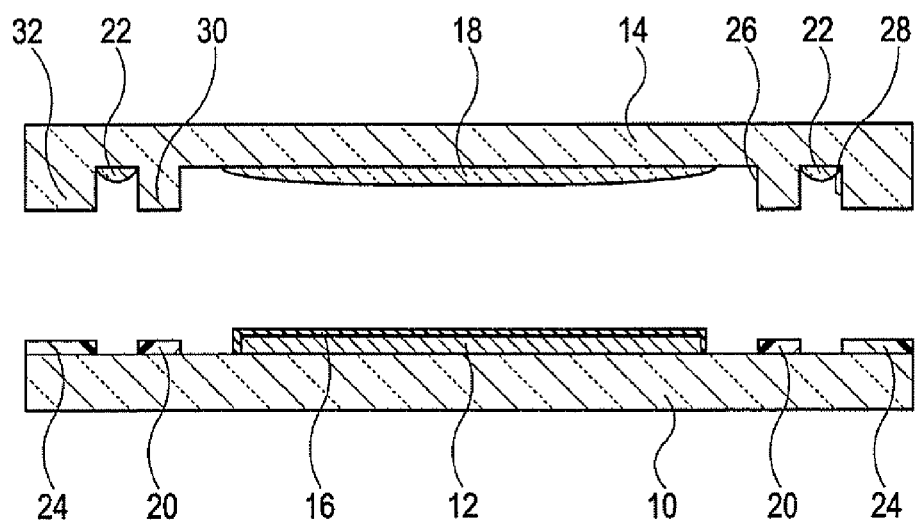
FIG. 5B is a sectional view taken along line VB-VB of FIG. 5A.

Referring to FIGS. 5A and 5B, the first adsorber 18 is formed inside the first seal 20 on the sealing substrate 14 by applying an adsorbent material in a substantially rectangular pattern overlapping the protective layer 16 in plan view. In addition, the second adsorber 22 is formed between the first seal 20 and the second seal 24 on the sealing substrate 14 by applying an adsorbent material in a rectangular frame pattern surrounding the first seal 20 in plan view. The adsorbent material used, as described above, is preferably a mixture of an adsorbent and a binder. The first adsorber 18 can readily be formed in the planar shape shown in FIG. 5A by applying the adsorbent material using a dispenser or an ink-jet apparatus.

The adsorbent material preferably has a viscosity of 20 Pa·s or more when applied to the sealing substrate 14. With such a relatively high viscosity, the shape of the adsorbent material can be maintained after the adsorbent material is applied to the sealing substrate 14. The adsorbent material preferably has a higher viscosity than the resin material for forming the first seal 20, which is applied to a region surrounding the first adsorber 18.

After the adsorbent material is applied to the sealing substrate 14, it may be subjected to preliminary curing as in the step of forming the first seal 20 and the second seal 24. The preliminary curing effectively prevents the adsorbent material from excessively wetting the sealing substrate 14 over time and contacting and interfering with the light-emitting element 12 or the second seal 24, thus increasing the yield of the organic EL device 2 and the ease of handling of the substrate 10.

In this embodiment, the first adsorber 18 is disposed such that the gap 42 (see FIG. 1D) is formed between the first adsorber 18 and the protective layer 16. The gap 42 can be used as a buffer region when the sealing substrate 14 is bonded to the substrate 10. If the gap 42 remains after the sealing substrate 14 is bonded, it also functions as a region for trapping water, oxygen, and the like intruding into the inner region through the first seal 20, thus inhibiting intrusion of water and the like into the inside of the protective layer 16.

In addition, the second adsorber 22 is disposed such that the gap 44 (see FIG. 1B) is formed between the second adsorber 22 and the substrate 10. The gap 44 can be used as a buffer region when the sealing substrate 14 is bonded to the substrate 10. If the gap 44 remains after the sealing substrate 14 is bonded, it also functions as a region for trapping water, oxygen, and the like intruding into the inner region through the second seal 24, thus inhibiting intrusion of water and the like into the inside of the first seal 20.

After the first adsorber 18 and the second adsorber 22 are formed on the sealing substrate 14, the sealing substrate 14 is bonded to the substrate 10 (see FIG. 1B). In the production process of the organic EL device 2 according to this embodiment, the step of bonding the sealing substrate 14 is carried out in a vacuum environment so that no bubbles remain between the sealing substrate 14 and the first seal 20. After the sealing substrate 14 is bonded, the environment is returned to atmospheric pressure, so that the sealing substrate 14 is pressed toward the light-emitting element 12 by atmospheric pressure. Subsequently, if the resin material used for the first seal 20 is a thermosetting resin, a predetermined amount of heat is applied to the resin material on the substrate 10.

After the above steps, the resin material is cured, forming the first seal 20. The organic EL device 2 can thus be produced, with the sealing substrate 14 bonded to the substrate 10 with the first seal 20 therebetween.

In this embodiment, when the resin material is applied to the substrate 10, the protective layer 16, which has been formed on the substrate 10, limits the region where the resin material spreads over the substrate 10. This prevents the first seal 20 from becoming thinner than designed due to excessive spreading of the resin material and also prevents formation of a gap between the sealing substrate 14 and the first seal 20.

In the method for producing the organic EL device 2 according to this embodiment, as described above, the resin material and the adsorbent material are applied after the protective layer 16 is formed on the light-emitting element 12. This prevents degradation of the light-emitting element 12 due to contact with the solvents, for example, contained in the resin material and the adsorbent material during the sealing step, thus enabling high-yield production of the organic EL device 2.

Organic EL Devices According to Other Embodiments

Figure 6A:
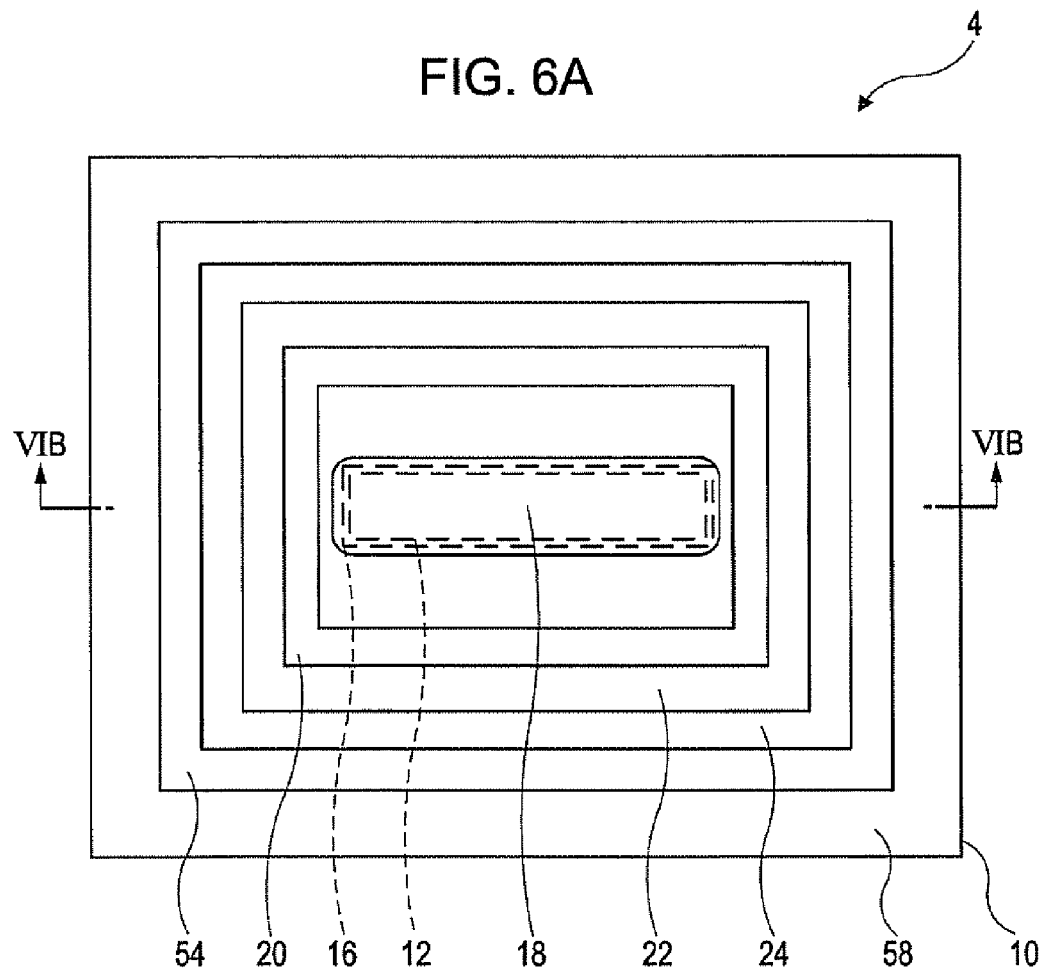
FIG. 6A is a plan view of an organic EL device according to another embodiment of the invention.
Figure 6B:
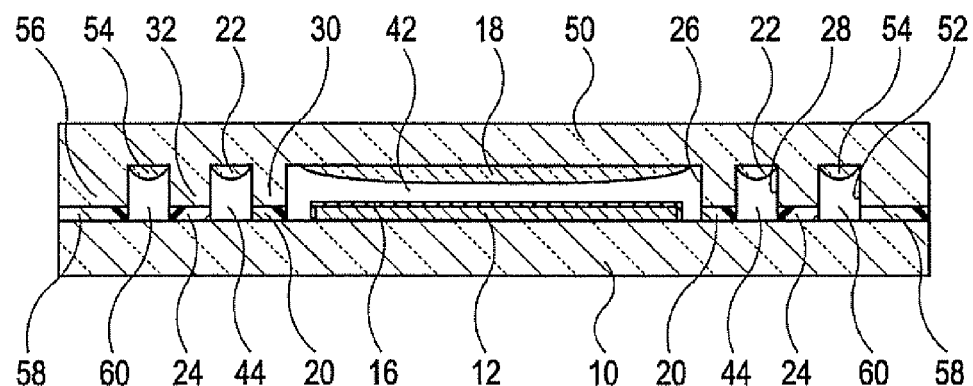
FIG. 6B is a sectional view taken along line VIB-VIB of FIG. 6A.

FIG. 6A is a plan view of an organic EL device 4 according to another embodiment of the invention. FIG. 6B is a sectional view taken along line VIB-VIB of FIG. 6A. For illustration purposes, a sealing substrate 50 is not shown in FIG. 6A. The organic EL device 4 according to this embodiment has the same structure as the organic EL device 2 according to the embodiment described above except that the sealing substrate 50 has a third recess 52 having a rectangular frame shape surrounding the periphery of the second recess 28 in plan view.

The sealing substrate 50 covers the light-emitting element 12, the protective layer 16, the first adsorber 18, the second adsorber 22, and a third adsorber 54. The sealing substrate 50 is bonded to the substrate 10 with the first seal 20, the second seal 24, and a third seal 58 therebetween so that the light-emitting element 12 is sealed therebetween. The first seal 20 is disposed on the first protrusion 30 around the first recess 26. The second seal 24 is disposed on the second protrusion 32 around the second recess 28. The third seal 58 is disposed on a third protrusion 56 around the third recess 52.

The third adsorber 54 is provided in the third recess 52 of the sealing substrate 50. The third adsorber 54 has a rectangular frame shape surrounding the periphery of the second seal 24 in plan view and is disposed between the substrate 10 and the sealing substrate 50. In this embodiment, as shown in FIG. 6B, of the two substrates 10 and 50, the third adsorber 54 is in contact with the sealing substrate 50, and a gap 60 is formed between the third adsorber 54 and the substrate 10.

In the organic EL device 2 according to the embodiment described above, the protective layer 16 is surrounded by the double seal, namely, the first seal 20 and the second seal 24. This prevents water (moisture), oxygen, and the like passing through the second seal 24 from intruding into the inside of the second adsorber 22, thus ensuring the protection of the light-emitting element 12. In the organic EL device 4 according to this embodiment, on the other hand, the protective layer 16 is surrounded by the triple seal, namely, the first seal 20, the second seal 24, and the third seal 58. This ensures the protection of the light-emitting element 12 more reliably, so that the organic EL device 4 has a higher reliability and a longer life.

Figure 7A:
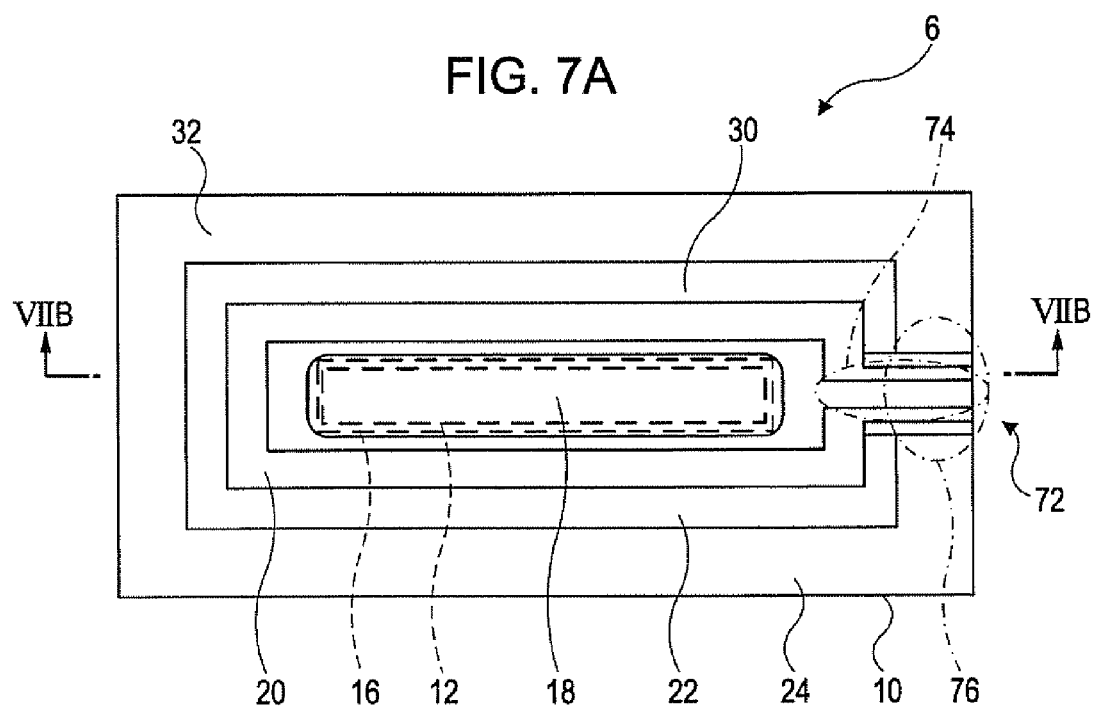
FIG. 7A is a plan view of an organic EL device according to another embodiment of the invention.
Figure 7B:
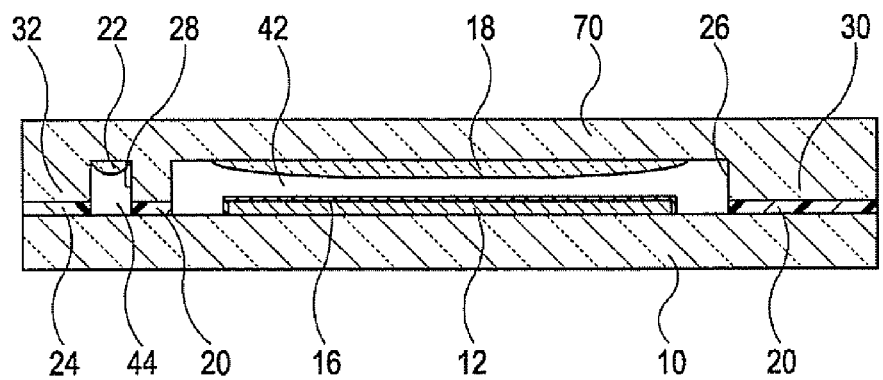
FIG. 7B is a sectional view taken along line VIIB-VIIB of FIG. 7A.

FIG. 7A is a plan view of an organic EL device 6 according to another embodiment of the invention. FIG. 7B is a sectional view taken along line VIIB-VIIB of FIG. 7A. For illustration purposes, a sealing substrate 70 is not shown in FIG. 7A. The organic EL device 6 according to this embodiment has the same structure as the organic EL device 2 according to the embodiment described above except that the sealing substrate 70 has a seal opening 72 formed by partially joining the first protrusion 30 and the second protrusion 32 together.

The first seal 20 on the first protrusion 30 has a first discontinuous portion 74 at the seal opening 72 where the frame shape of the first seal 20 is interrupted. The second seal 24 on the second protrusion 32 has a second discontinuous portion 76 at the seal opening 72 where the frame shape of the second seal 24 is interrupted. The first discontinuous portion 74 extends outward to the second discontinuous portion 76.

Referring to FIG. 8A, the seal opening 72 is sealed with opening-sealing members 78. Referring to FIG. 5B, the opening-sealing members 78 may be integrated around the periphery of the sealing substrate 70.

If the substrate 10 is pressed against the sealing substrate 70, as needed, so that they are firmly bonded together, the pressure can also be applied to and damage the light-emitting element 12 on the substrate 10. In addition, the pressure can impair the hermeticity of the first seal 20 and the second seal 24 on the substrate 10.

For example, the first seal 20 and the second seal 24 are provided on the substrate 10, which is then stacked on the sealing substrate 70 with the light-emitting element 12 sealed in the space (sealed space) surrounded by the first seal 20 and the second seal 24. Subsequently, the substrate 10 is pressed against the sealing substrate 70 so that the first seal 20 and the second seal 24 are pressed and spread therebetween. Afterwards, the first seal 20 and the second seal 24 are cured.

When the substrate 10 is stacked on and pressed against the sealing substrate 70, the volume of the sealed space is decreased as the first seal 20 and the second seal 24 are pressed, and the internal pressure of the sealed space is increased accordingly. This increased internal pressure can cause the first seal 20 and the second seal 24 to spread unevenly and therefore form an uneven sealing line at which the substrate 10 and the sealing substrate 70 are bonded together. This results in variations in adhesion strength among final products. In addition, the gas in the sealed space escapes by forming pores (airways) in the first seal 20 and the second seal 24; some of them remain after the curing of the first seal 20 and the second seal 24. This results in variations in panel life among final products due to variations in internal pressure. In particular, if numerous airways remain, they can impair the sealing of the light-emitting element 12. In the organic EL device 6 according to this embodiment, therefore, the seal opening 72 is provided to relieve the pressure, thereby preventing the damage.

EXAMPLES

Organic EL Display

Next, an organic EL display 100 will be described as an example of an organic EL device with reference to FIGS. 9 to 12.

Figure 9:
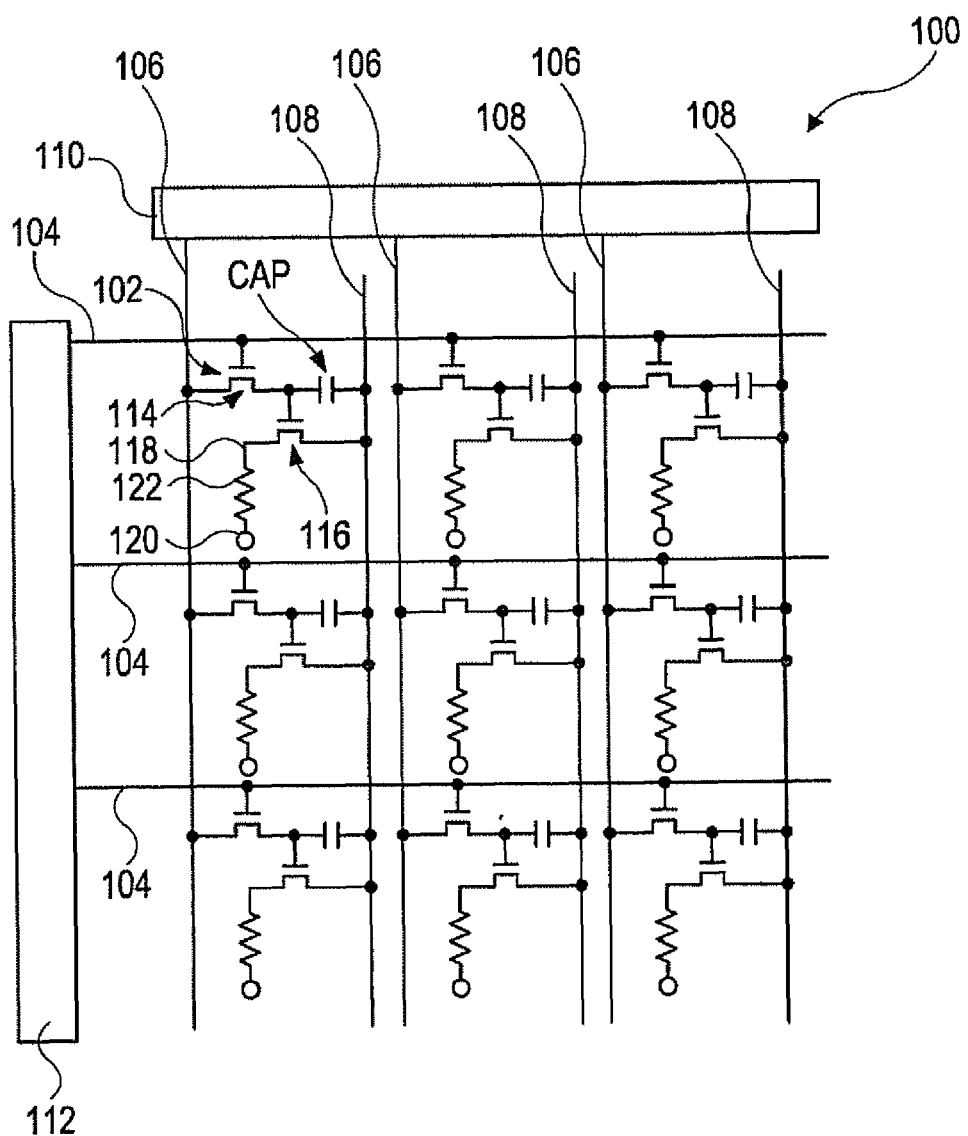
FIG. 9 is a circuit diagram of an organic EL display as an example of an organic EL device.
Figure 12:
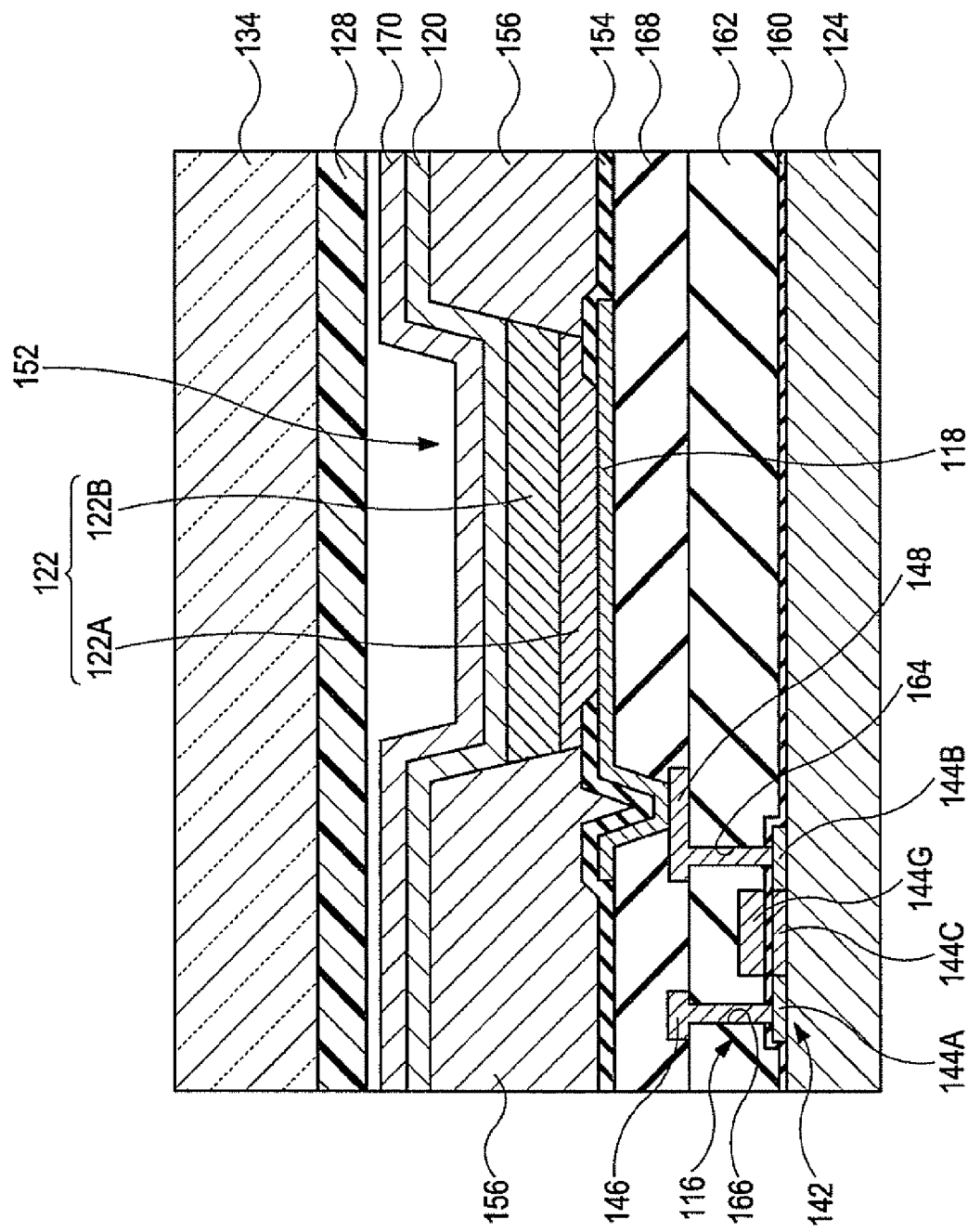
FIG. 12 is a sectional view taken along line XII-XII of FIG. 11A.

FIG. 9 is a circuit diagram of the organic EL display 100 of this example. FIG. 10 is a plan view of the display 100. FIGS. 11A and 11B show the planar structure of pixels 102 on the display 100: FIG. 11A is a diagram showing a pixel-driving section of a pixel 102, including a thin-film transistor (TFT); and FIG. 11B is a diagram showing a bank (partition) partitioning the pixels 102. FIG. 12 is a sectional view taken along line XII-XII of FIG. 11A.

In the circuit configuration shown in FIG. 9, the organic EL display 100 includes scanning lines 104, signal lines 106 extending in a direction crossing the scanning lines 104, and common supply lines 108 extending in parallel with the signal lines 106. The pixels 102 are disposed at the intersections of the scanning lines 104 and the signal lines 106.

The signal lines 106 are provided with a data-side drive circuit 110 including, for example, a shift register, a level shifter, a video line, and an analog switch. The scanning lines 104, on the other hand, are provided with a scanning-side drive circuit 112 including, for example, a shift register and a level shifter. The pixels 102 include switching TFTs 114 whose gate electrodes are supplied with scanning signals via the scanning lines 104, hold capacitors CAP that hold image signals supplied from the signal lines 106 via the switching TFTs 114, drive TFTs 116 whose gate electrodes are supplied with the image signals held by the hold capacitors CAP, pixel electrodes 118 into which a drive current flows from the common supply lines 108 when the pixel electrodes 118 are electrically connected to the common supply lines 108 via the drive TFTs 116, and light-emitting portions 122 held between the pixel electrodes 118 and a common electrode 120. The pixel electrodes 118, the common electrode 120, and the light-emitting portions 122 constitute organic EL elements (light-emitting elements).

In the above configuration, the scanning lines 104 are driven to switch on the switching TFTs 114, 50 that the potential of the signal lines 106 at that time is held by the hold capacitors CAP. The state of the hold capacitors CAP determines the on/off state of the drive TFTs 116. A current flows from the common supply lines 108 to the pixel electrodes 118 via channels of the drive TFTs 116 and then flows to the common electrode 120 via the light-emitting portions 122. The light-emitting portions 122 emit light in response to the current flowing therethrough.

In the planar structure of FIG. 10, the organic EL display 100 has a display region 126 where the pixels 102 are arranged in a matrix in plan view in substantially the center of a rectangular substrate 124. A first adsorber 128 is disposed over the display region 126. A first seal 130 has a rectangular frame shape in plan view and is disposed around the display region 126 and the first adsorber 128. A second adsorber 132 has a rectangular frame shape in plan view and is disposed around the first seal 130. A second seal 134 has a rectangular frame shape in plan view and is disposed around the second adsorber 132. A sealing substrate 136 is disposed so as to cover the display region 126, the first adsorber 128, the first seal 130, the second adsorber 132, and the second seal 134 in plan view.

That is, the organic EL display 100 has the same basic structure as the organic EL device 2 according to the embodiment described above. The organic EL elements of the pixels 102 arranged in the display region 126 correspond to the light-emitting element 12 of the organic EL device 2. The display region 126 is double-sealed by the first seal 130 and the second seal 134 with the second adsorber 132 provided therebetween.

The gap 42 (see FIG. 1B) is formed between the first adsorber 128 and the display region 126. As in the embodiment described above, water and the like intruding into the gap 42 through the first seal 130 diffuse across the gap 42, so that the load on the first adsorber 128 can be uniformly distributed over its surface. This inhibits local degradation of the first adsorber 128, thus increasing the reliability of the organic EL display 100. In addition, the gap 44 (see FIG. 1B) is formed between the second adsorber 132 and the substrate 124. As in the embodiment described above, water and the like intruding into the gap 44 through the second seal 134 diffuse across the gap 44, so that the load on the second adsorber 132 can be uniformly distributed over its surface. This inhibits local degradation of the second adsorber 132, thus increasing the reliability of the organic EL display 100.

In the planar structure of the pixel 102 shown in FIG. 11A, the four sides of the pixel electrode 118, which is substantially rectangular in plan view, is surrounded by the signal line 106, the common supply line 108, the scanning line 104, and the scanning line (not shown) for another pixel electrode 118. The switching TFT 114 and the drive TFT 116 are disposed beside the pixel electrode 118.

The switching TFT 114 is a top-gate TFT mainly including a rectangular island-like semiconductor layer 138. The scanning line 104 crossing the semiconductor layer 138 functions as the gate electrode of the switching TFT 114 at their intersection. The semiconductor layer 138 is electrically connected via a contact hole C1 to a branch line 106A extending along the scanning line 104 from the signal line 106, which extends in the vertical direction of FIG. 11A. The semiconductor layer 138 is also electrically connected via a contact hole C2 to a relay electrode 140 that is rectangular in plan view and that is disposed on the right of the pixel electrode 118 in FIG. 11A.

The drive TFT 116 is a top-gate TFT mainly including a rectangular island-like semiconductor layer 142. The drive TFT 116 includes a gate electrode 144G, a source electrode 146 (part of the supply line 108), and a drain electrode 148. The drain electrode 148 is electrically connected to the pixel electrode 118 via a contact hole (see FIG. 12). The gate electrode 144G extends from a region above the semiconductor layer 142 to the bottom of FIG. 11A and is integral with an electrode 150 of the hold capacitor CAP. The electrode 150, in turn, extends to the bottom of FIG. 11A and is electrically connected via a contact hole C3 to the relay electrode 140, which overlaps the electrode 150 in plan view. Accordingly, the gate of the drive TFT 116 is electrically connected to the drain of the switching TFT 114 via the relay electrode 140.

In the sectional structure of the pixel 102 in FIG. 12, the drive TFT 116 is disposed on the substrate 124. A plurality of insulating films are formed over the drive TFT 116, and an organic EL element 152 is formed on the substrate 124 with the insulating films therebetween. The organic EL element 152 mainly includes an organic functional layer (light-emitting portion) 122 provided in a region surrounded by a bank (an inorganic bank layer 154 and an organic bank layer 156) on the substrate 124. The organic functional layer 122 is held between the pixel electrode 118 and the common electrode 120. In the planar structure shown in FIG. 11B, the organic bank layer 156 has an opening 158 having a substantially rectangular shape in plan view corresponding to the region where the pixel electrode 118 is formed. The organic functional layer 122 is formed in the opening 158.

Referring back to FIG. 12, the drive TFT 116 mainly includes the semiconductor layer 142, which has a source region 144A, a drain region 144B, and a channel region 144C, and the gate electrode 144G, which is disposed opposite the channel region 144C with a gate insulating film 160 therebetween. The gate insulating film 160 is disposed on the surface of the semiconductor layer 142. A first interlayer insulating film 162 is disposed over the semiconductor layer 142 and the gate insulating film 160. The drain electrode 148 and the source electrode 146 are embedded in contact holes 164 and 166, respectively, reaching the semiconductor layer 142 through the first interlayer insulating film 162 and are electrically connected to the drain region 144B and the source region 144A, respectively. A second interlayer insulating film 168 is disposed on the first interlayer insulating film 162. Part of the pixel electrode 118 is embedded in a contact hole passing through the second interlayer insulating film 168. The pixel electrode 118 is electrically connected to the drain electrode 148 so that the drive TFT 116 is electrically connected to the pixel electrode 118 (organic EL element 152).

The inorganic bank layer (first partitioning layer) 154, formed of an inorganic insulating material, is disposed on the second interlayer insulating film 168 so as to cover part of the periphery of the pixel electrode 118. The organic bank layer (second partitioning layer) 156, formed of an organic material, is disposed on the inorganic bank layer 154. The inorganic bank layer 154 and the organic bank layer 156 constitute a partition in the organic EL display 100.

The organic EL element 152 includes a hole-transporting layer 122A and a light-emitting layer 122B stacked on the pixel electrode 118. The common electrode 120 is disposed over the light-emitting layer 1223 and the organic bank layer 156. That is, the organic EL element 152 of this example corresponds to the light-emitting element 12 of the embodiment described above: the pixel electrode 118, the hole-transporting layer 122A, the light-emitting layer 122B, and the common electrode 120 correspond to the anode 34, the hole-transporting layer 36, the light-emitting layer 38, and the cathode 40, respectively, in the light-emitting element 12.

The hole-transporting layer 122A is disposed over the surface of the pixel electrode 118. The periphery of the hole-transporting layer 122A covers end portions of the inorganic bank layer 154 that extend from the bottom of the organic bank layer 156 toward the center of the pixel electrode 118.

A protective layer 170 corresponding to the protective layer 16 in the embodiment described above is disposed on the common electrode 120. The first adsorber 128 is disposed over the protective layer 170.

The organic EL display 100 thus configured includes the first adsorber 128, the second adsorber 132, the first seal 130, and the second seal 134, as in the organic EL device 2 according to the embodiment described above. The double sealing structure of the first seal 130 and the second seal 134 provides excellent sealing performance for the organic EL element 152.

Optical Write Head

Next, as another example, an optical write head including an organic EL device will be described with reference to FIGS. 13 and 14.

Figure 13:
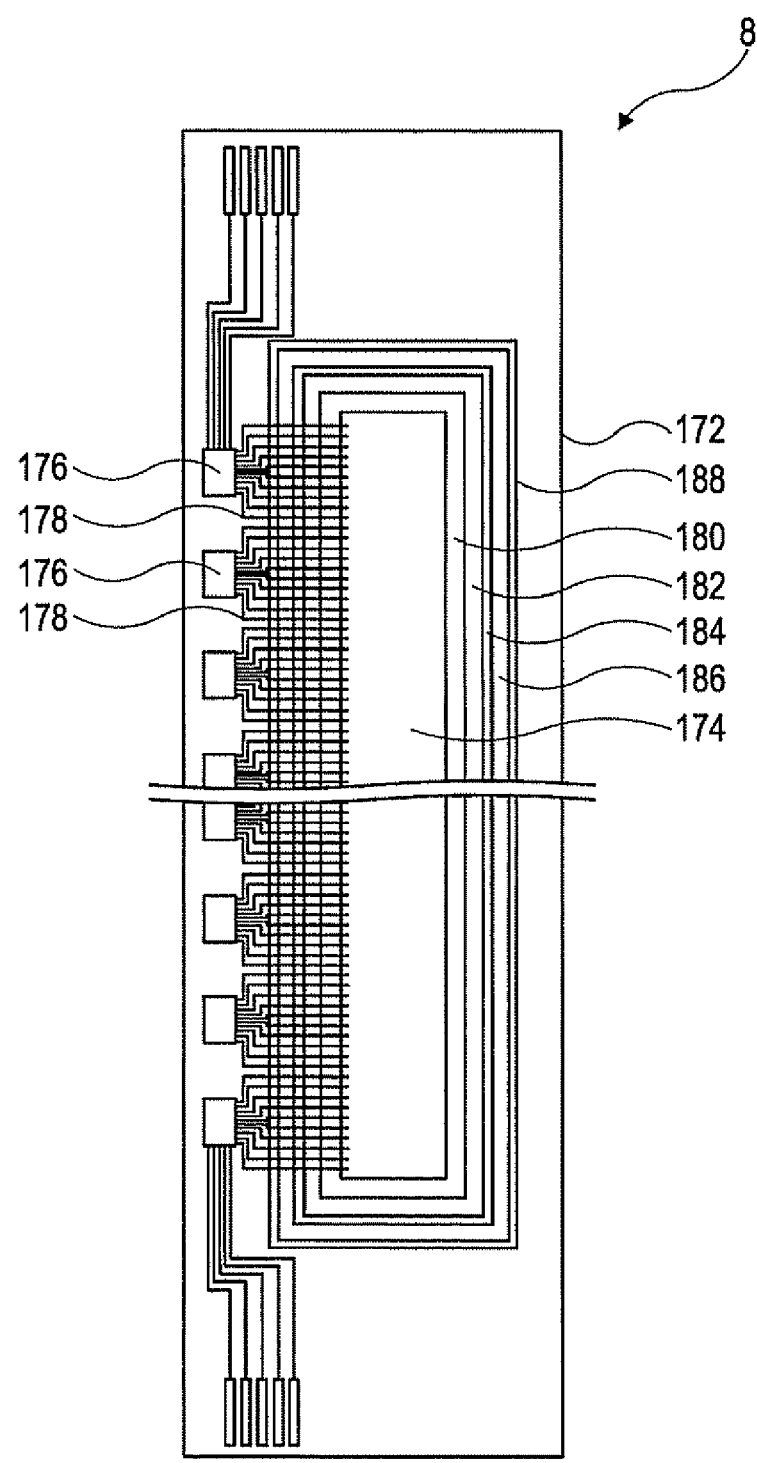
FIG. 13 is a plan view of an organic EL device for an optical write head as another example of an organic EL device.

FIG. 13 is a plan view of an organic EL device having a structure suitable for the optical write head of this example.

Referring to FIG. 13, an organic EL device 8 has a light-emitting element region 174 in which organic EL elements (not shown) are arranged on a substrate 172. The light-emitting element region 174 extends in the longitudinal direction of the substrate 172. A plurality of drive elements 176 are arranged along the light-emitting element region 174. Although the details are omitted in FIG. 13, the organic EL elements in the light-emitting element region 174 are electrically connected to wiring lines 178 extending from the drive elements 176 and are driven by electrical signals supplied from the drive elements 176.

The organic EL device 8 of this example has the same sealing structure as the organic EL device 2 according to the embodiment described above. That is, the organic EL device 8 includes a protective layer (not shown) disposed on the surfaces of the organic EL elements in the light-emitting element region 174, a first adsorber 180 disposed over the light-emitting element region 174, a first seal 182 disposed around the first adsorber 180, a second adsorber 184 disposed around the first seal 182, and a second seal 186 disposed around the second adsorber 184. A sealing substrate 188 is bonded to the substrate 172 so as to cover the first adsorber 180, the first seal 182, the second adsorber 184, and the second seal 186.

The organic EL device 8 thus configured includes the first adsorber 180, the second adsorber 184, the first seal 182, and the second seal 186, as in the organic EL device 2 according to the embodiment described above. The double sealing structure of the first seal 182 and the second seal 186 provides excellent sealing performance for the light-emitting element region 174.

Figure 14:
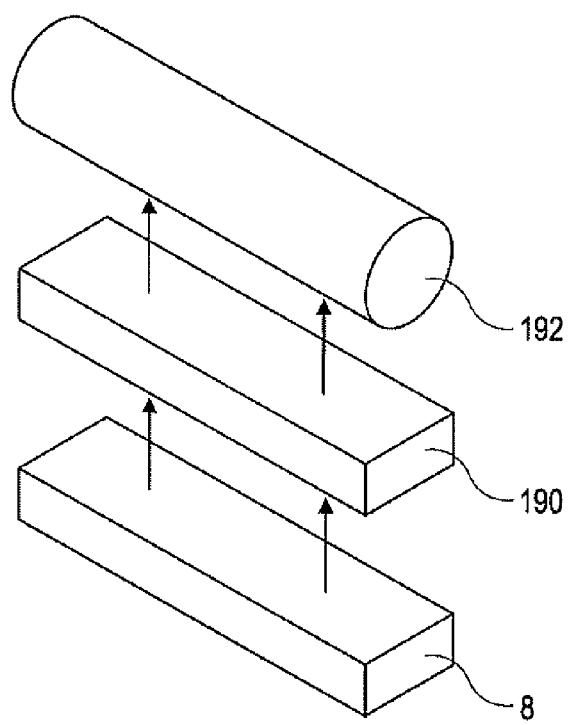
FIG. 14 is a schematic diagram showing the optical write head of this example.

FIG. 14 is a diagram showing an example of the application of the organic EL device 8 to an optical write head (printer head) for an electrophotographic printer. In FIG. 14, an optical system 190 is disposed on the side of the organic EL device 8 to which it emits light (above the organic EL device 8 in FIG. 14), and a photoconductive drum (photoconductor) 192 is disposed above the optical system 190. The light-emitting device 8 emits light toward the optical system 190. The light enters the optical system 190 and is collected thereby before impinging on the photoconductive drum 192. In this example, the organic EL device 8 has excellent sealing performance for the light-emitting element region 174, thus increasing the total reliability of an electrophotographic printer.

Electronic Apparatus

Next, an example of an electronic apparatus including the organic EL display 100 will be described.

Figure 15:
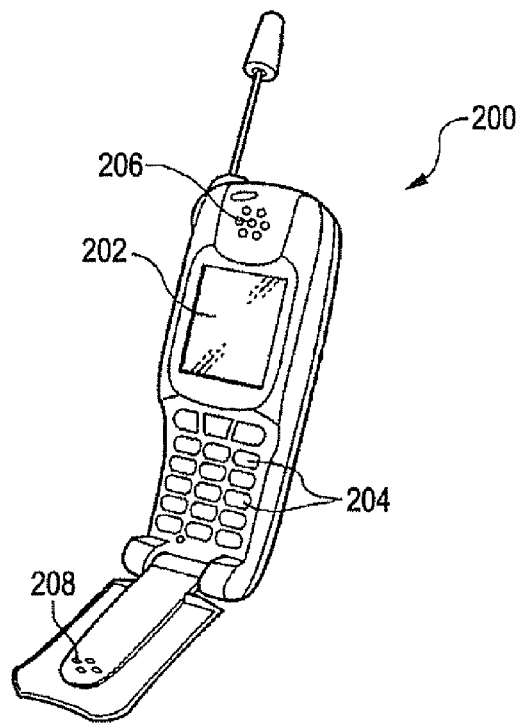
FIG. 15 is a perspective view showing an example of an electronic apparatus.

FIG. 15 is a perspective view showing an example of a cellular phone. In FIG. 15, a cellular phone 200 includes a display unit 202 including the organic EL display 100 described above, operating buttons 204, an earpiece 206, and a mouthpiece 208. The electronic apparatus shown in FIG. 15, including the organic EL display 100 described above, has excellent sealing performance for the organic EL elements because of the double sealing structure of the first seal 182 and the second seal 186.

What is claimed is:

1. A light-emitting device comprising:
   a substrate on which a laminate is disposed, the laminate including a first electrode, a second electrode, and an electrooptical material therebetween, the electrooptical material at least including a light-emitting layer;
   a sealing substrate bonded to the substrate with a plurality of seals therebetween, the seals having the shape of a double or multiple frame surrounding the periphery of the laminate on the substrate, wherein the plurality of seals include:
     a first seal surrounding the periphery of the laminate on the substrate; and
     a second seal surrounding the periphery of the first seal;
   a plurality of mounting sites in regions surrounded by the seals on the sealing substrate, wherein the plurality of mounting sites include:
     a first mounting site in a region surrounded by the first seal on the sealing substrate; and a second mounting site in a region surrounded by the first seal and the second seal on the sealing substrate, the first and second mounting sites each having a recess, wherein:

the first seal is disposed on a first support formed of a protrusion around the recess in the first mounting site; and the second seal is disposed on a second support formed of a protrusion around the recess in the second mounting site;

a plurality of adsorbers disposed in the mounting sites to adsorb water and oxygen, wherein the plurality of adsorbers include:
 a first adsorber in the first mounting site; and
 a second adsorber in the second mounting site;

a seal opening formed by partially joining the first and second supports together;

a first discontinuous portion where the frame shape of the first seal on the first support is interrupted at the seal opening; and a second discontinuous portion where the frame shape of the second seal on the second support is interrupted at the seal opening;

wherein the first discontinuous portion extends outward to the second discontinuous portion; and the seal opening is sealed by a plurality of opening-sealing members.

2. The light-emitting device according to claim 1, wherein the plurality of seals have a rectangular shape in plan view.

3. The light-emitting device according to claim 1, wherein the first and second adsorbers have different adsorption capabilities.

4. The light-emitting device according to claim 3, wherein the first adsorber adsorbs a larger amount of water and oxygen than the second adsorber.

5. The light-emitting device according to claim 3, wherein the second adsorber adsorbs water and oxygen at a higher rate than the first adsorber.

6. The light-emitting device according to claim 1, wherein the plurality of opening-sealing members are integrated.

7. The light-emitting device according to claim 1, wherein no adsorber is disposed at a position on the sealing substrate opposite the laminate on the substrate.

* * * * *